(12) United States Patent
Ueno et al.

(10) Patent No.: US 6,723,281 B1
(45) Date of Patent: Apr. 20, 2004

(54) METAL MATERIAL FOR ELECTRONIC PARTS, ELECTRONIC PARTS, ELECTRONIC APPARATUSES, AND METHOD OF PROCESSING METAL MATERIALS

(75) Inventors: Takashi Ueno, Tokyo (JP); Katsuhisa Aratani, Chiba (JP)

(73) Assignees: Sony Corporation, Tokyo (JP); Furuyametals Co., Ltd., Tokyo (JP)

( * ) Notice: Subject to any disclaimer, the term of this patent is extended or adjusted under 35 U.S.C. 154(b) by 0 days.

(21) Appl. No.: 09/613,892

(22) Filed: Jul. 11, 2000

(30) Foreign Application Priority Data

Jul. 12, 1999 (JP) .......................................... P11-196878
Mar. 28, 2000 (JP) ...................................... P2000-092980

(51) Int. Cl.[7] .................................................. C22C 5/06
(52) U.S. Cl. ...................................... 420/503; 420/505
(58) Field of Search ............................... 420/503, 505; 148/678, 430

(56) References Cited

U.S. PATENT DOCUMENTS

| | | | |
|---|---|---|---|
| 5,171,643 A | * | 12/1992 | Suzuki et al. ............... 428/671 |
| 5,837,616 A | * | 11/1998 | Yamanaka .................. 438/735 |
| 5,876,862 A | * | 3/1999 | Shibuya et al. ............. 428/672 |
| 6,291,137 B1 | * | 9/2001 | Lyons et al. ................ 430/313 |

FOREIGN PATENT DOCUMENTS

| | | |
|---|---|---|
| JP | 56119747 | 9/1981 |
| JP | 06036970 | 2/1994 |
| JP | 06314517 | 11/1994 |
| SU | 386021 | 6/1973 |

* cited by examiner

*Primary Examiner*—George Wyszomierski
*Assistant Examiner*—Janelle Combs Morillo
(74) *Attorney, Agent, or Firm*—Sonnenschein, Nath & Rosenthal LLP

(57) ABSTRACT

The present invention relates to a metal material for electronic parts, electronic parts, electronic apparatuses, a method of processing metal materials, and electro-optical parts. For example, the present invention is applied to liquid crystal display panels, various semiconductor devices, wiring boards, chip parts, and the like. The present invention proposes a metal material for electronic parts which is characterized by lower resistivity, higher stability, and more excellent processability than the prior art. The present invention also proposes electronic parts and electronic apparatuses which use this metal material. An applicable metal material is an alloy containing Ag as a main component, 0.1 to 3 wt % of Pd, and 0.1 to 3 wt % in total of elements such as Al.

22 Claims, 3 Drawing Sheets

METAL MATERIAL FOR ELECTRONIC PARTS, ELECTRONIC PARTS, ELECTRONIC APPARATUSES, AND METHOD OF PROCESSING METAL MATERIALS

Metal material for electronic parts, electronic parts, electronic apparatuses, and method of processing metal materials

BACKGROUND OF THE INVENTION

The present invention relates to a metal material for electronic parts, electronic parts, electronic apparatuses, and method of processing metal materials. For example, the present invention can be applied to liquid crystal display panels, various semiconductor devices, wiring boards, chip parts, and the like. The present invention uses metal material, more specifically an alloy comprising Ag as a main component, 0.1 to 3 wt % of Pd, and a total of 0.1 to 3 wt % of elements such as Al, Accordingly, the present invention provides a metal material for electronic parts, electronic parts and apparatuses using this metal material, whereby the metal material is characterized by lower resistivity, higher stability, and more excellent processability than the prior art.

Conventionally, wires, electrodes, and contacts of electronic parts and apparatuses use metal materials such as pure metals including Cu, Al, Mo, Ta, W, Cr, and the like, and alloys including Al—Cu, Al—Cu—Si, Al—Pd, TaSi, WSi, and the like for forming wiring patterns.

For example, a transparent liquid crystal display panel constituting a flat panel display generally uses pure Al as a wiring material because of excellent etching characteristics and low electrical resistance. However, pure Al shows a melting point of as low as 660° C. Using pure Al as wiring material for liquid crystal display panels leaves the possibility of causing defects such as a hillock and a whisker during heat treatment at approximately 300° C. to 400° C. for a chemical vapor deposition (CVD) process after wiring film formation. Some types of liquid crystal display panels prevent these defects by using high-melting point materials for wiring such as Ta, Mo, Cr, W, and the like which are stable at a high temperature instead of pure Al.

A reflective liquid crystal display panel requires a high-reflectance layer which reflects transmitted light through liquid crystal cells. Such a high-reflectance layer or members for wiring patterns and electrodes functioning as a high-reflectance layer use pure Al, an Al-based alloy, pure Ag, an Ag-based alloy, Au, and the like. An electro-optical part (hereafter called an electro-optical part using micromirrors) uses micromirrors arranged on a silicon chip and displays images by means of optical modulation of each mirror. Such an electro-optical part uses pure Al for mirror members.

If there is provided a metal material which is characterized by lower electrical resistance, higher stability, and more excellent processability than metal materials used for conventional electronic apparatuses, using such a metal material for various electronic parts can improve performance and simplify manufacturing processes.

A transparent liquid crystal display panel uses Ta, Mo, Cr, W, and the like instead of pure Al in order to prevent defects. As shown in Table. 1, however, these materials have a disadvantage of larger resistivity than pure Al. If the transparent liquid crystal display panel becomes larger and provides higher resolution, the wire length for wiring patterns increases and wiring patterns become much finer, making it difficult to provide easy, reliable operations. For this reason, optimal wiring materials are unavailable for transparent liquid crystal display panels.

TABLE 1

| MATERIAL | RESISTIVITY [$\mu\Omega$cm] | CHEMICAL RESISTANCE | ANODIC OXIDATION |
|---|---|---|---|
| Mo | 50 | LOW | IMPOSSIBLE |
| Cr | 12.9 | GOOD | IMPOSSIBLE |
| Ti | 55 | EXCELLENT | IMPOSSIBLE |
| Ta | 13.6 | EXCELLENT | POSSIBLE |
| Al | 2.7 | LOW | POSSIBLE |
| Cu | 1.7 | LOW | IMPOSSIBLE |
| Ag | 1.6 | GOOD | IMPOSSIBLE |
| Au | 2.3 | EXCELLENT | IMPOSSIBLE |

A reflective liquid crystal display panel and an electro-optical part using micromirrors allow wires and electrodes to serve as a high-reflectance layer. In this case, it is necessary to add requirements for a high-reflectance layer to wiring material characteristics for transparent liquid crystal display panels.

From the viewpoint of effectively reflecting incident light on the high-reflectance layer, pure Ag is an optimal material for high-reflectance layers because pure Ag provides the highest reflectance in a visible light wavelength region. However, pure Ag has weak corrosion resistance, not suitable for a wiring or electrode material. For this reason, optimal wiring materials are not always available also for reflective liquid crystal display panels and electro-optical parts using micromirrors.

In consideration of these points, the reflective liquid crystal display panel uses a barrier layer formed on, or on and below the high-reflectance film and the wiring electrode layer to improve corrosion resistance. However, increasing steps for forming barrier layers complicates the manufacturing process. Further, if the barrier layer is formed, its reliability remains unstable under high-temperature conditions.

As low-resistance wiring materials, Au, Cu, and Ag show lower resistivity than that of Al. However, Au is not easily available. Cu is characterized by poor corrosion resistance, provides degraded processability by etching, and presents difficult problems in fine processing. Ag excessively reacts on chloride, sulfur, and sulfide, offering problems in fine processing and corrosion resistance.

For example, Ag reacts excessively during a dry etching process by means of etching gas containing chlorine. As the etching process proceeds, Ag reacts on chlorine in the etching gas, generating AgCl on a boundary surface of the wiring pattern. This AgCl degrades electrical conductivity and thermal conductivity.

Here is an example in which Ag causes problems concerning corrosion resistance. When Ag is applied to a reflective liquid crystal display panel, there is a strong possibility of reacting on oxygen or a small amount of sulfur and the like on an interface by direct contact with a transparent conducting layer. Similarly to Al, it is necessary to form a barrier layer on the substrate layer or place the substrate layer between barrier layers in a sandwich structure.

In many cases, these liquid crystal display panels use a TFT (thin film transistor) comprising amorphous silicon or polycrystal silicon as a drive device. Presently, optimal electrode materials are unavailable from the viewpoint of drive devices.

Some of these drive devices simplify a manufacturing process by oxidizing metal material of electrodes and forming a gate insulating film between this electrode and a silicon active element. This is called an anodic oxidation method.

Of wiring materials shown in Table 1, Al and Ta can form gate insulating films. Especially, Ta can form an oxide insulating film which causes little defects such as pinholes and provides a high yield. However, Ta is characterized by high resistivity. When the anodic oxidation method is used, an electrode structure requires 2-layer wiring using Al with low resistivity, increasing manufacturing processes. When the 2-layer wiring is used, the resistivity of wiring patterns becomes same as that determined by Al.

In addition to application to the above-mentioned display devices, semiconductor devices such as DRAM, flash memory, CPU, MPU, and ASIC require a narrower wiring width due to high integration. The wiring length for wiring patterns is becoming longer due to increasing chip sizes and complicated wiring such as multilayer interconnection. These semiconductor devices also require wiring materials which are characterized by low resistivity, stable operations, and excellent processability.

Narrowing the wiring width and extending the wiring length increases the wiring resistance. Increasing the resistance also increases a voltage drop on wiring and decreases a drive voltage for elements. Further, the power consumption increases, causing a delay in signal transmission due to the wiring.

In addition to these semiconductor devices, electronic parts such as printed-wiring boards, chip capacitors, and relays use Cu and Ag for wiring, electrode, and contact materials. These materials also provide practically incomplete corrosion resistance and make the recycled use difficult.

The present invention has been made in consideration of the foregoing. The invention aims at proposing a metal material for electronic parts which is characterized by lower resistivity, more stable operations, and more excellent processability than existing materials. The invention also aims at proposing electronic parts, electronic apparatuses, electro-optical parts using this metal material, and a method of processing the metal material.

SUMMARY OF THE INVENTION

For solving these problems, applies to a metal material for electronic parts. The metal material comprises an alloy of Ag as a main component, 0.1 to 3 wt % of Pd, and 0.1 to 3 wt % in total of at least any one or a plurality of elements selected from a group consisting of Al, Au, Pt, Cu, Ta, Cr, Ti, Ni, Co, and Si.

The invention applies to a metal material for electronic parts. The metal material comprises an alloy of Ag as a main component, 0.1 to 3 wt % of Pd, and 0.1 to 3 wt % of an element selected from a group consisting of Al, Au, Pt, Cu, Ta, Cr, Ti, Ni, Co, and Si.

The invention applies to electronic parts made of a specific metal material, wherein wiring patterns, electrodes, or contacts are formed on these parts. The metal material comprises an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si.

The invention applies to electronic apparatuses made of a specific metal material, wherein wiring patterns, electrodes, or contacts are formed on these parts. The metal material comprises an alloy of Ag as a main component, 0.1 to 3 wt % of Pd, and 0. to 3 wt % in total of one or a plurality of elements selected from a group consisting of Al, Au, Pt, Cu, Ta, Cr, Ti, Ni, Co, and Si. The invention applies to a processing method of metal materials. The processing method forms wiring patterns, electrodes, or contacts by using a solution containing phosphoric acid to etch a metal film comprising an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si.

The invention applies to a processing method of metal materials. The processing method forms wiring patterns, electrodes, or contacts by using a gas atmosphere containing chlorine to etch a metal film comprising an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si.

The invention applies to a device processing method including metal materials. When the metal material includes a metal film comprising an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si, the processing method processes materials other than the above-mentioned metal film by using etching in a gas atmosphere containing fluorine.

The invention applies to a processing method of metal materials. The processing method forms wiring patterns, electrodes, or contacts by heat-treating a metal film within a temperature range from 300° C. to 750° C. Thereby, the metal film comprises an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si. The invention applies to a processing method of metal materials. The processing method forms wiring patterns, electrodes, or contacts on a substrate made of W, Ta, Mo, indium tin oxide, titanium nitride, silicon oxide, or silicon nitride, Si or amorphous Si. Thereby, wiring patterns, electrodes, or contacts comprise an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si.

The invention applies to a processing method of metal materials. The processing method forms wiring patterns, electrodes, or contacts by directly forming a metal film on a glass or plastic substrate. Thereby, the metal film comprises an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si.

The invention applies to electro-optical parts made of a specific metal material, wherein reflection films, wiring patterns, electrodes, or contacts are formed on these parts. The metal material comprises an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si.

It is possible to improve weather resistance for the entire Ag by adding Pd to Ag and evenly mixing Pd into the grain boundary of Ag. Decreasing the resistivity is possible by adding one or a plurality of elements selected from a group consisting of Al, Au, Pt, Cu, Ta, Cr, Ti, Ni, Co, and Si. This third element can suppress a rate of increase in the resistivity. Improving the weather resistance requires 0.1 to 3 wt % of elements to be added.

It is possible to produce an alloy by providing an AgPd alloy with 0.1 to 3 wt % of one or a plurality of elements selected from a group consisting of Al, Au, Pt, Cu, Ta, Cr, Ti, Ni, Co, and Si. Such an alloy maintains excellent thermal conductivity of pure Ag. This alloy can conform to conventional film formation processes such as the sputtering method, the vaporization method, the CVD method, and the plating method. The alloy can easily provide patterning by means of the wet etching technique and the dry etching technique. The alloy can maintain stable states at a high temperature.

It is possible to provide a metal material for electronic parts which is characterized by lower resistivity, more stable operations, and more excellent processability than existing materials.

It is possible to provide electronic parts whose wiring patterns, electrodes, or contacts use a metal material for electronic parts, wherein the material is characterized by low resistivity, stable operations, and excellent processability.

It is possible to provide electronic apparatuses whose wiring patterns, electrodes, or contacts use a metal material for electronic parts, wherein the material is characterized by low resistivity, stable operations, and excellent processability.

Such a ternary alloy permits etching using a phosphoric-acid-based etching solution such as $H_3PO_4+HNO_3+CH_3COOH$. It is possible to control an etching rate by adding water, cerium nitrate, and silver nitrate as well as phosphoric acid, nitric acid, and acetic acid.

It is possible to provide a patterning technique appropriate to this type of metal materials in addition to conventional patterning techniques.

Such a ternary alloy permits dry etching in a gas atmosphere containing chlorine. For example, RIE (reactive ion etching) and plasma etching are available in a gas atmosphere containing chlorine such as $Cl_2$, $CCl_4$, $BCl_3$, and $SiCl_4$.

It is possible to provide a patterning technique appropriate to this type of metal materials in addition to conventional patterning techniques.

This ternary alloy makes it difficult to perform dry etching in a gas atmosphere containing fluorine, providing an advantage that the alloy is free from a damage due to these gases. It is possible to prevent the ternary alloy from being etched by means of RIE or plasma etching in a gas atmosphere containing fluorine such as $CF_4$, $C_3F_8$, $C_4F_8$, and $SF_6$. However, it is also possible to etch other mate such as Si, polycrystal Si, amorphous Si, $SiO_2$, $Si_3N_4$, Mo, W, Ta, Ti, and Pt.

The present invention can be applied to devices comprising this type of metal materials and the other materials and provide an optimal patterning technique.

The present invention can be applied to a processing method of metal materials. It is possible to form, say, deposition layers composed of this alloy using vaporization, CVD, or the like, and then alloy them. The alloy excels in stability at a high temperature. It is possible to maintain a stable state during high-temperature processes after film formation using various film formation methods. The alloy can be applied to various devices requiring high-temperature processes, thus providing wiring patterns and the like which are stable and excel in processability.

The present invention can be applied to a processing method of metal materials. Wiring patterns, electrodes, or contacts made of this type of alloy are formed on a substrate comprising any one of W, Ta, Mo, indium tin oxide, titanium nitride, silicon oxide, and silicon nitride. Conventional processing processes are applied to ensure sufficient adhesion properties. There are provided wiring patterns and the like which are characterized by low resistivity, stable operations, and excellent processability.

The present invention can be applied to a processing method of metal materials. Wiring patterns, electrodes, or contacts made of this type of alloy can be directly formed on a glass or plastic board. In this case, Al suppresses an increase in the resistivity because such an alloy is subject to little effects of oxygen. Accordingly, an easy manufacturing process can be employed to effectively fabricate wiring patterns with low resistivity.

The present invention can provide electro-optical parts whose reflection films, wiring patterns, or electrodes are made of a metal material which is characterized by low resistivity, stable operations, and excellent processability and reflectance.

As mentioned above, a metal material according to the present invention can be an alloy of Ag as a main component, 0.1 to 3 wt % of Pd, and 0.1 to 3 wt % in total of elements such as Al. There can be provided a metal material for electronic parts, electronic parts and apparatuses using this metal material, whereby the metal material is characterized by lower resistivity, higher stability, and more excellent processability than the prior art.

DETAILED DESCRIPTION OF THE INVENTION

Figure 1:
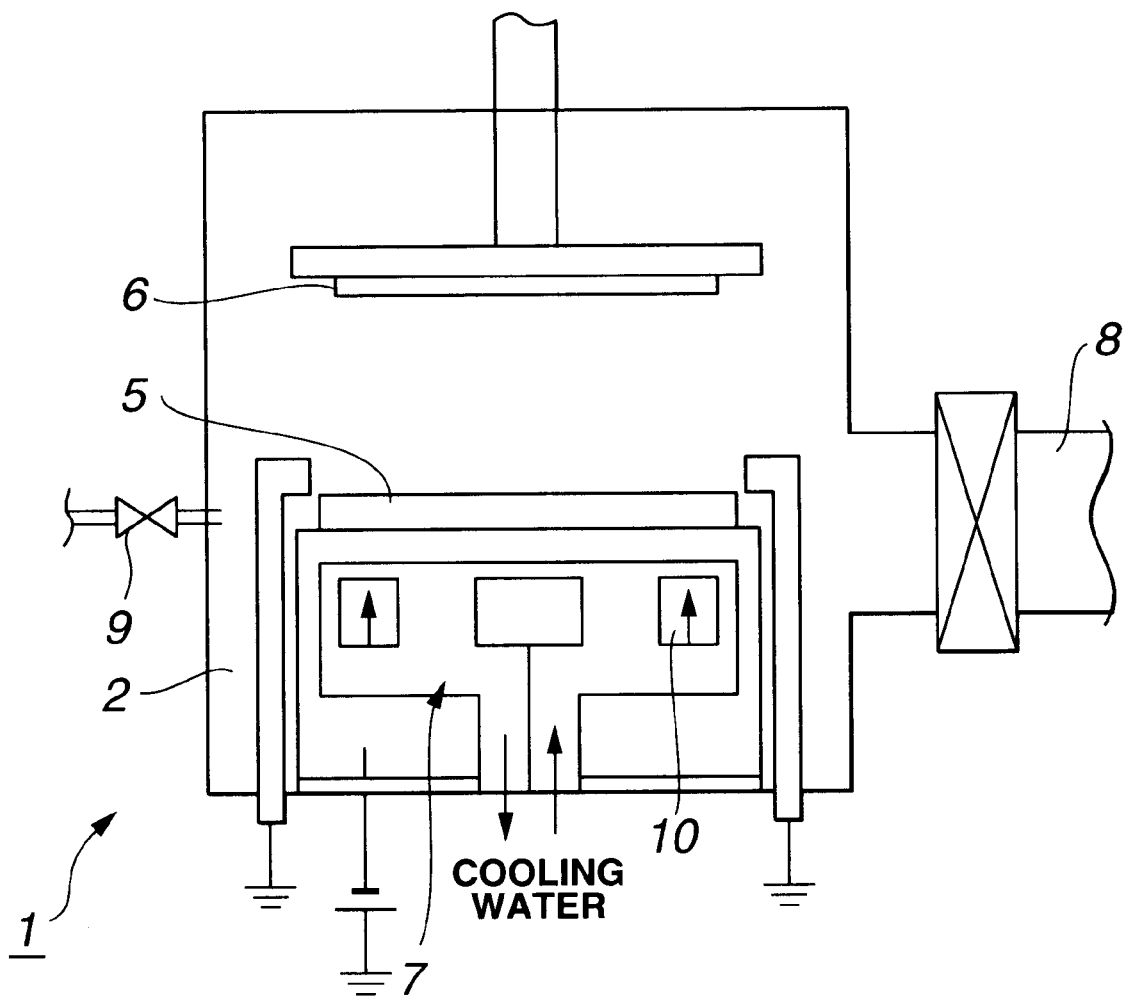
FIG. 1 is a schematic cross sectional view of a liquid crystal display panel to which an Ag alloy according to the invention is applicable.

The present invention will now be described in detail through use of exemplary embodiments with reference to the accompanying drawings.

This embodiment uses a metal material for various electronic parts which is an alloy of Ag as a main component, 0.1 to 3 wt % of Pd, and 0.1 to 3 wt % in total of one or a plurality of elements selected from a group consisting of Al, Au, Pt, Cu, Ta, Cr, Ti, Ni, Co, and Si. In this case, various electronic parts include display devices such as transparent liquid crystal display panels, reflective liquid crystal display panels, organic EL (electro luminescence) panels, plasma displays, electro-optical parts using micromirrors and the like, various semiconductor devices, printed-wiring boards, chip capacitors, relays and the like. These alloys are applied to wiring materials, electrode materials, high-reflection film materials, contact materials and the like, and sputtering target materials used for wiring manufacturing and the like.

It is well known that corrosion resistance for the entire Ag can be improved by adding Pd to Ag and mixing Pd into the grain boundary of Ag. However, just adding Pd to Ag for ensuring sufficient corrosion resistance increases resistivity. It is possible to decrease the resistivity or suppress an increase in the resistivity by adding one or a plurality of elements selected from a group consisting of Al, Au, Pt, Cu, Ta, Cr, Ti, Ni, Co, and Si. Improving the corrosion resistance requires 0.1 to 3 wt % of the third element to be added. Adding this element more than 3 wt % degrades the corrosion resistance.

The silver alloy with improved corrosion resistance maintains characteristics of pure Ag which provides the most excellent electrical conductivity, thermal conductivity, and reflectance in metal elements. This alloy can provide metal materials with excellent corrosion resistance, low resistivity, high thermal conductivity, and high reflectance.

Especially, when the alloy is applied to wiring materials, selecting an additional element from the above-mentioned group can ensure a value of 3 $\mu\Omega$cm or less which is required for wiring materials. It is known that a criteria for practically usable wiring materials is not to exceed the resistivity of widely used AlSi alloys. An experiment results in the resistivity of 1.6 $\mu\Omega$cm or more. Depending on needs, it is possible to ensure the resistivity of 3.5 $\Omega$cm or less required for this AlSi alloy.

Such a silver alloy is not an eutectic-reaction alloy material, but a complete solid solution. Also from a microscopic viewpoint, the silver alloy can stably provide uniform characteristics. These complete solid-solution metal alloys maintain malleability of Ag. Because of little deterioration by film stresses, for example, a stress occurrence is decreased on a thick film over 1 $\mu$m or a rolled sheet. Accordingly, the alloy can provide excellent processability, stable operations at a high temperature, and improved reliability compared to conventional materials such as Al, Mo, Cr, Ti, Ta, and Cu.

With respect to Ag processing methods, the dry etching uses chlorine-based composite gas. The wet etching uses nitric-acid-based etchant. These methods can be also used for etching the Ag alloy according to this embodiment. It is possible to apply various processing methods accumulated for conventional Ag alloys.

Chlorinated gases include, say, $Cl_2$, $CCl_4$, $BCl_3$, $SiCl_4$. In these atmospheres, RIE or plasma etching can be used for processing films of the Ag alloy according to this embodiment. A dry etching process using chlorinated etching gas can be applied to Ag-based wiring patterns. As the etching proceeds, chlorine in the gas reacts on Ag and generates AgCl on a boundary surface in the wiring pattern. This AgCl degrades electrical conductivity and thermal conductivity. It is confirmed that the Ag alloy film according to this embodiment causes no such reaction.

Of HCl, $Cl_2$, $CCl_4$, $BCl_3$ and $SiCl_4$ that are popularly used as dry etching gas, $Cl_2$ can most advantageously be used for fine processing and is followed by HCl and $BCl_3$. The processing effect of the dry etching process can be improved by using a mixture obtained by adding iodine-containing gas such as HI to of any of those gasses, or $Cl_2$+HI, HCl+HI or $BCl_3$+HI.

Etching in the chlorinated gas atmosphere can provide an optimal patterning technique during a manufacturing process of electronic parts using this type of metal materials.

The ternary alloy makes it difficult to perform dry etching in a gas atmosphere containing fluorine but not chlorine, providing an advantage of avoiding damages by this type of gas. The RIE or plasma etching in a gas atmosphere of, say, $CF_4$, $C_3F_8$, $C_4F_8$, or $SF_6$ can etch other materials such as polycrystal Si, amorphous Si, $SiO_2$, $Si_3N_4$, Mo, W, Ta, Ti, and Pt without causing any effects on such ternary alloy.

Processing in a gas atmosphere containing fluorine but not chlorine permits selectively etch portions other than the ternary alloy. This method also can provide a patterning technique which is optimally applied to this type of metal materials.

Presently the wet etching in the liquid crystal display manufacturing equipment uses an etchant containing phosphoric acid for etching pure Al and the like. Phosphoric etchants include, say, $H_3PO_4$+$HNO_3$+$CH_3COOH$. It has been difficult to use such etchants for etching conventional pure Ag or an alloy of two or three elements including Ag as a main component.

It has become evident that such a phosphoric complex can be used for etching an alloy of Ag as a main component, 0.1 to 3 wt % of Pd, and 0.2 to 3 wt % of element Cu or Ti. Conventional Al-based etching equipment can be effectively used for etching. Similarly to the prior art, it is also possible to control an etching rate by adding water, cerium nitrate, and silver nitrate as well as phosphoric acid, nitric acid, and acetic acid.

The post-treatment after etching such as washing can use the same process as that for pure Al, Al alloys, and the like. It is possible to decrease possibilities of environmental pollution compared to a case where Al materials are etched.

The material according to the present invention can be more processible than conventional materials such as Al, Mo, Cr, Ti, Ta, and Cu.

This Ag alloy can be easily, reliably formed by means of conventional film formation processes such as the sputtering method, the vaporization method, the CVD method, and the plating method. The sputtering method can sputter this Ag alloy approximately three times faster than Al materials. This means that the Ag alloy features a fast thin film formation with respect to the sputtering method. This can shorten the film formation time and the time required for the entire production. Because the main component Ag is a precious metal, it can be collected and recycled more easily than the other metals.

For the purpose of the invention, the sputtering apparatus 1 is used in combination with a sputtering apparatus typically having a configuration as shown in FIG. 1. Referring to FIG. 1, the sputtering apparatus 1, a target member 5 made of an Ag alloy according to the invention and a substrate 6 where the Ag alloy emitted from the target member 5 is deposited are arranged in a vacuum tank 2. A sputtering process proceeds in the vacuum tank 2 as the target member 5 is cooled by cooling circuit 7 using water and argon gas, for instance, is fed into the vacuum tank 2 by way of gas supply port 9, while air is drawn out of the vacuum tank 2 by means of suction pump 8. A magnetron sputtering process proceeds in the magnetic field generated by magnet 10 of the sputtering apparatus 1.

When the sputtering method, vaporization, or the like is used for film formation, heating is required for alloying. Heat treatment ranging from 300° C. to 750° C. can produce a metal film which is characterized by low resistivity, high stability, and excellent processability.

Adherence to substrate materials is important for processing processes. Excellent adherence can be ensured by using W, Ta, Mo, indium tin oxide, titanium nitride, silicon oxide, or silicon nitride for substrates. For various semiconductor devices and the like, conventional Al-based wiring patterns can be easily replaced and advantageous characteristics can be ensured.

When an Al-based thin film is directly formed on plastic or glass, Al reacts on oxygen to cause a considerably large resistance value, namely twice to three times larger than the resistance of bulk materials. However, the Ag alloy according to the invention is subject to a little effect of oxygen and decreases an increase in the resistivity due to direct formation of thin films on plastic or glass. It is possible to produce wiring patterns and the like with excellent characteristics by directly forming wiring patterns and the like on plastic or glass. A simple manufacturing process can be used to create wiring patterns and the like with low resistivity.

The Ag alloy can be applied to wiring patterns of transparent liquid crystal display panels. If the wiring length increases and the wiring becomes fine due to large display sizes or high resolutions, it is possible to provide easy, secure operations, improve reliability, and decrease the power consumption.

Meanwhile, the reflection film used in a reflection type liquid crystal display panel is desired to show a high reflectivity to visible light over the entire wavelength range thereof. In the case of Ag, it shows a reflectivity of about 90% to light with a wavelength of 400 nm. However, in the case of AgPd (0.9 wt %) Cu (1.0 wt %), its reflectivity to light with a wavelength of 400 nm is reduced to about 86%. The reduction in the reflectivity to light with a wavelength of 400 nm can be minimized without degrading the chemical stability by replacing part of the Cu contained in the above alloy with Al.

An Ag-containing alloy such as AgPd (0.9 wt %) Cu (0.3 wt %) Al (0.7 wt %) can improve the reflectivity to light with the above wavelength to 88%. Thus, the reflectivity to light over a short wavelength range between about 380 nm and about 500 nm of the film can be improved without degrading the chemical stability of the film.

Accordingly, the Ag alloy can be applied to wiring patterns of reflective liquid crystal display panels for providing effects equivalent to transparent liquid crystal display panels. Applying the Ag alloy to a high-reflection film stably ensures high reflectance and forms a bright display screen.

Figure 2:
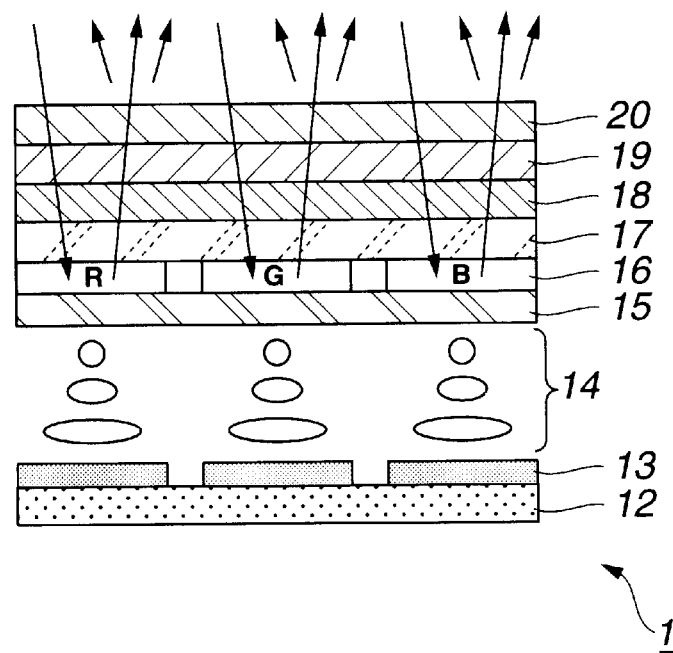
FIG. 2 is a schematic cross sectional view of another liquid crystal display panel to which an Ag alloy according to the invention is applicable.

A reflection type color liquid crystal display panel will be briefly described as an example of TFT liquid crystal display device realized by applying an Ag alloy according to the invention. As shown in FIG. 2, the reflection type color liquid crystal display panel 11 comprises a reflection electrode 13, a liquid crystal layer 14, a transparent electrode 15, a color filter 16, a glass substrate 17, a phase difference film 18, a polarizing plate 19 and a scattering plate 20 laid sequentially on a glass substrate 11. The reflection electrode 13 is made of the above described Ag alloy material.

The reflection type color liquid crystal display panel 11 of FIG. 2 is of the type utilizing the mirror surface of a reflection electrode 13 and a scatting plate 20, basically such an arrangement can be applied to any electrode that is paired with a transparent electrode. A reflection electrode made of an Ag alloy according to the invention provides the advantages of a low resistivity as electrode material, a high reliability of operation and a high reflectivity when applied to a reflection type device.

It may be needless to say that a liquid crystal display device may be of the reflection type or of the transmission type and an Ag alloy according to the invention may also be used for liquid crystal display devices of the latter type. Additionally, an Ag alloy according to the invention can be used not only for liquid crystal driving electrodes as shown in FIG. 2 but also for reflection type color liquid crystal display panels using an active matrix drive system.

A reflection type color liquid crystal display panel as described above can advantageously be used as the display panel of a portable telephone set, a PDA (Personal Digital Assistant) or some other portable information terminal because of its low power consumption rate. A TFT formed by using an Ag alloy according to the invention and used in a liquid crystal display panel of the above described type does not need to be provided with a barrier layer for preventing Al or any known Al alloy from reacting with and/or spreading into some other material.

Figure 3:
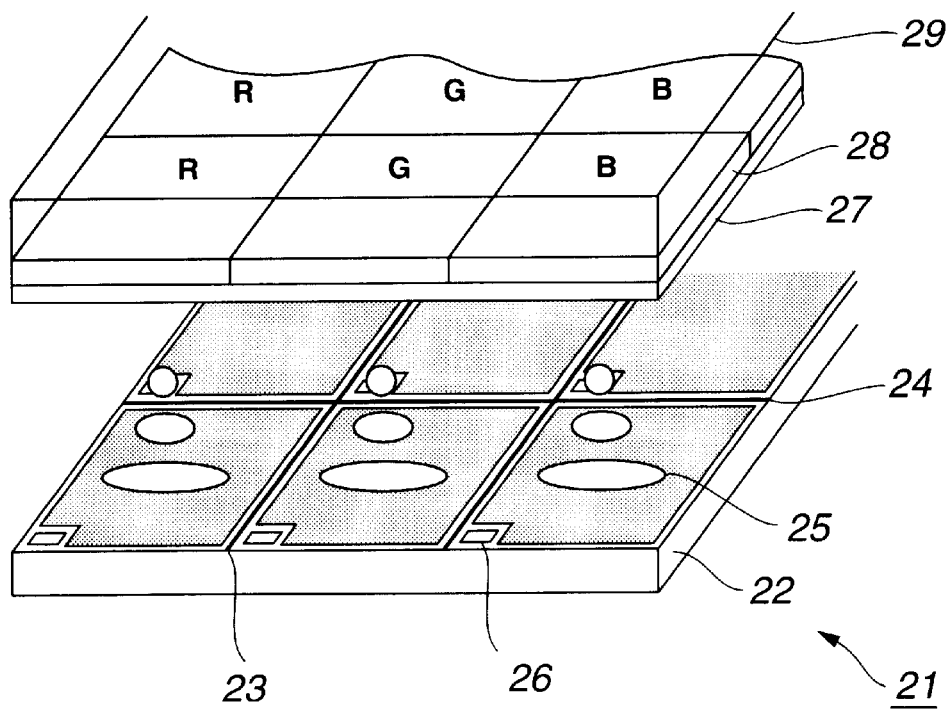
FIG. 3 is a schematic cross sectional view of a flash memory cell to which an Ag alloy according to the invention is applicable.

As shown in FIG. 3, a reflection type color liquid crystal display panel 21 of the above described type has a liquid crystal layer 25 formed in each of the regions on a glass substrate 22 and separated by data lines 23 and word lines 24. A switching element 26 is electrically connected to the liquid crystal layer 25 of each of the regions. As shown in FIG. 3, the reflection type color liquid crystal display panel 21 additionally comprises a transparent electrode 27, a color filter 28 and a glass substrate 29 laid sequentially on the liquid crystal layer 25.

An Ag alloy according to the invention can be used for various electrodes of a switching element such as TFT including the gate electrode, the drain electrode and/or some other electrodes as well as for wires connecting them. Additionally, it can also be used for various display devices including electroluminescence (EL) devices, filed emission devices (FED) and plasma display panels (PDP).

Still additionally, an Ag alloy according to the invention can also advantageously be used for the reflection type liquid crystal reflection film, the reflection electrode and the wires connecting such electrodes of a liquid crystal display panel, for the gate electrode, the electrode of the gate region, that of the drain region and the wires connecting such electrodes of the TFT of a transmission type liquid crystal device and for the back electrode and the wires connecting it of a plasma display device.

Similarly, the Ag alloy can be applied to reflection films, electrodes, or wiring patterns for optical modulation devices such as electro-optical parts using micromirrors. Because of high reflectance and low resistance, it is possible to form devices capable of high brightness and fast operations.

The Ag alloy can be applied to the anodic oxidation method using Ta for these liquid crystal display panels and various semiconductor devices. A 2-layer structure using this silver alloy and Ta, for example, can provide sufficiently small resistance values.

Figure 4:
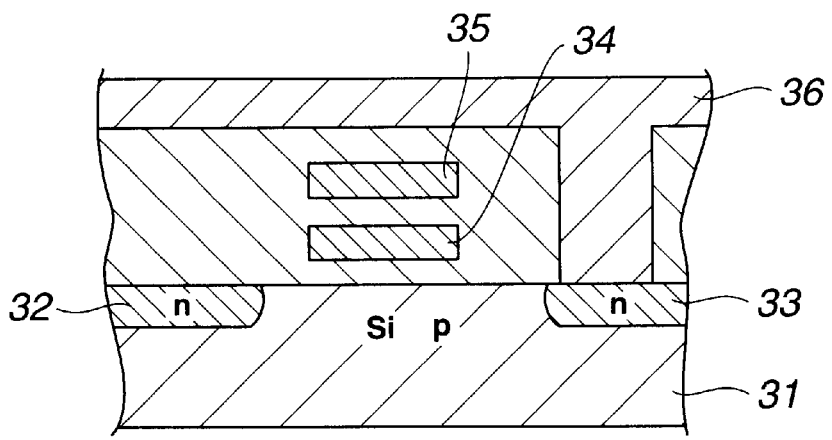
FIG. 4 is a schematic cross sectional view of an electronic part formed by applying the present invention.

FIG. 4 illustrates a flash memory cell operating as the smallest storage unit of a flash memory for which an Ag alloy according to the invention can be used.

As shown in FIG. 4, the flash memory cell comprises a source region 32 and a drain region 33 formed on a p-type silicon layer 31 along with a floating gate 34, a control gate 35 and bit lines 36 that are made of an Ag alloy.

While FIG. 4 shows a n-type channel metal oxide semiconductor device (nMOS: Metal Oxide Semiconductor) having bit lines 36 made of an Ag alloy, the applicable scope of an Ag alloy according to the invention is not limited to the bit lines of nMOSs and includes the wires of almost all electronic devices such as p-type channel metal oxide semiconductor devices (pMOSs), bipolar transistors, BiCMOSs (Complementary Metal-Oxide Semiconductor devices, thin film transistors and memory devices using a ferroelectric material or a ferromagnetic material.

Figure 5:
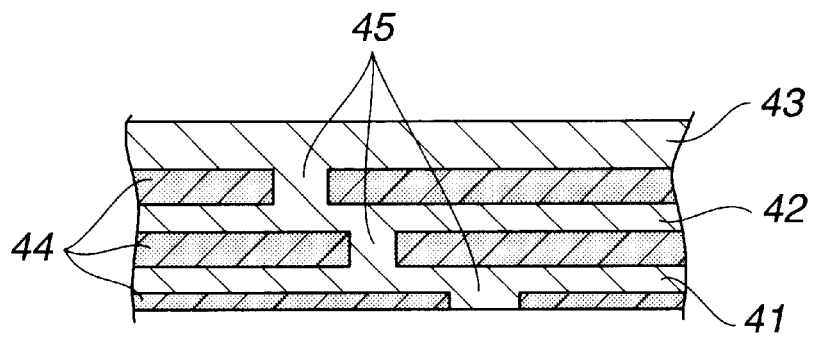
FIG. 5 is a schematic cross sectional view of another electronic part formed by applying the present invention.
Figure 6:
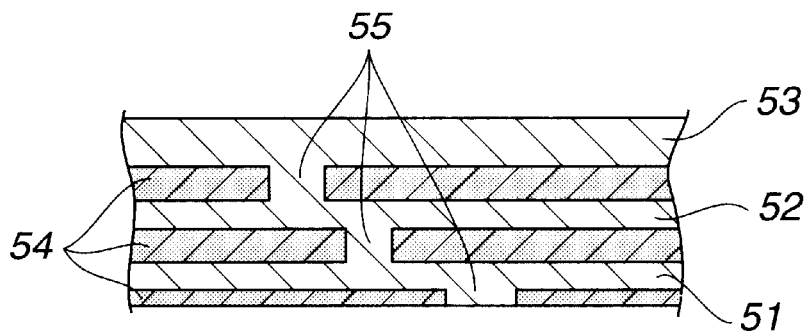
FIG. 6 is a schematic illustration of a sputtering apparatus that can be sued for processing a metal material for the purpose of the invention.

An Ag alloy according to the invention can be used not only as the material of a single wiring layer formed as the top layer of the device as shown in FIG. 4 but also as that of multi-layer wiring arrangements as shown in FIGS. 5 and 6. The semiconductor device of FIG. 5 has a three-layered arrangement of the first, second and third layers 41, 42, 43 made of an Ag alloy and laid sequentially with insulating layers 44 interposed therebetween. Each of the first, second and third layers 41, 42, 43 is provided with a through hole 45.

The semiconductor device of FIG. 6 also has a three-layered arrangement of the first layer 51 typically made of polysilicon or slicide, the second layer 52 and the third layer 53 with insulating layers interposed therebetween, said second layer 52 and said third layer 53 being made of an Ag alloy. Again, each of the first, second and third layers 52, 53 is provided with a through hole 55.

With known multi-layer wiring arrangements, the wiring layers are typically made of polysilicon or a silicon compound such as $WSi_2$, $MoSi_2$ or $TaSi_2$ for the purpose of ensuring a chemical stability of the wiring layers in the hot processes subsequent to the wiring process. However, the above listed materials have a drawback of showing a high electric resistivity. While Al and Al alloys shows an electric resistivity considerably lower than that of any of the above high melting point materials, they have a drawback of a low melting point that is as low as 660° C. In view of these circumstance, an Ag alloy according to the invention can advantageously be used for multi-layer wiring arrangements because the melting point of silver is as high as 960° C. and the alloy is chemically stable at high temperature.

Semiconductor devices to which the present invention is applicable include CPUs (central processing units), MPUs (Micro-Processing Units), LSIs (Large-Scale Integrated circuits) having memories, DRAMs (Dynamic Random-Access Memories), SRAMs (Static RAMs), ROM (Read-Only Memories), PROM (Programmable ROMs), flash memories, FeRAMs (Ferroelectric RAMs), MRAMs (Magnetic RAMs), gate arrays, CCDs (Charge-Coupled Devices), MOSs image sensors and solar cells.

The Ag alloy can be also applied to wiring patterns of various semiconductor devices and prevent an increase in resistance values due to extended wiring lengths and fine wiring. This can also decrease the power consumption. It is also possible to prevent a voltage drop due to wiring and prevent signal delays, thus improving various characteristics and reliability.

The Ag alloy can be also applied to wiring patterns of printed wiring boards, chip parts electrodes, relay contacts, and the like, ensuring optimal characteristics and high reliability.

Now, the types and the effect of four-element alloys containing an Ag alloy will be discussed below. The problem of broken wires can arise when wires are made of Al or an Al alloy (such as AlSi) because the wires are exposed to high temperature in the device manufacturing process and a phenomenon referred to as migration of Al atoms occurs when the wires are used for a long time with a high current density. However, wires made of an Ag alloy according to the invention is excellent in terms of migration of atoms particularly, the Ag alloy is AgPdCuTi or AgPdCuCr. Particularly, AgPd (0.7–0.8 wt %) Cu (0.5 wt %) Ti (0.5 wt %) and AgPd (0.7–0.8 wt %) Cu (0.5 wt %) Cr (0.5 wt %) perform excellently in terms of micgration of atoms.

Embodiment

Table 2 shows a resistance values and chemical resistances of the above-mentioned silver alloys in comparison with conventionally used pure Al, Al-based alloys, and Ag alloys.

TABLE 2

| MATERIAL | RESISTIVITY [$\mu\Omega$cm] | CHEMICAL RESISTANCE |
| --- | --- | --- |
| Al | 2.69 | LOW |
| Cu | 1.7 | LOW |
| Ag | 1.6 | GOOD |
| Au | 2.3 | EXCELLENT |
| Al—1 wt % Cu | 3.26 | LOW |
| Al—0.5 wt % Si | 3.45 | LOW |
| Al—0.5 wt % Si—1 wt % Cu | 3.48 | LOW |
| Ag—2 wt % Au | 2.15 | GOOD |
| Ag—3 wt % Pd | 3.01 | GOOD |
| Ag—0.1 wt % Pd—0.1 wt % Cu | 1.75 | EXCELLENT |
| Ag—0.9 wt % Pd—1.0 wt % Cu | 1.93 | EXCELLENT |
| Ag—2.0 wt % Pd—2.0 wt % Cu | 2.44 | EXCELLENT |
| Ag—3.0 wt % Pd—0.1 wt % Cu | 2.98 | EXCELLENT |
| Ag—0.1 wt % Pd—3.0 wt % Cu | 1.96 | EXCELLENT |
| Ag—3.0 wt % Pd—3.0 wt % Cu | 2.76 | EXCELLENT |
| Ag—0.9 wt % Pd—1.0 wt % Cr | 3.44 | EXCELLENT |
| Ag—0.9 wt % Pd—1.0 wt % Si | 3.51 | EXCELLENT |
| Ag—0.9 wt % Pd—1.0 wt % Ti | 2.34 | EXCELLENT |

We created samples used for this measurement by forming a film of each composition on a silica board according to the RF sputtering method, and then performing heat treatment for three hours at 300° C. in a vacuum condition. All samples have a film thickness of 300 nm. We used the four probe method for measuring resistance values at a room temperature.

Of these metal materials, Ag shows the lowest resistivity. Adding other elements to Ag increases the resistivity. As a reference, an increase in resistance values is based on the resistivity of 3.5 $\mu\Omega$cm for most widely used AlSi alloys. An AgPdCu alloy satisfies this criterion when the addition volume of Pd is 0.1 to 3 wt %, and the addition volume of Cu is 0.1 to 3 wt %. A resistivity increase by addition of Cu is smaller than that by addition of Pd on condition that the volume added is same for Cu and Pd. When Cu is added to an AgPd alloy, there is a case where adding Cu decreases the resistivity.

In order to investigate resistivities when film formation methods other than sputtering are used for forming films, we formed Ag-1.0 wt % Pd-1.0 wt % Cu films using the vaporization, plating, and CVD methods. We measured resistivities using the above-mentioned measurement method. The measurement result shows that resistivities ranging from 1.90 to 1.98 $\mu\Omega$cm are detected in all of the vaporization, plating, and CVD methods. It has been found that almost equivalent films can be formed independently of film formation methods.

Table 3 shows a resistivities just after film formation without annealing. This measurement used the sputtering method to form a film as thick as 150 nm on an acrylic substrate. When a film is formed on such a plastic-based substrate, an Al-based alloy remarkably increases resistance values because of thin film properties, reaction on oxygen, and other reasons. The resistivity becomes twice to three times larger than that of bulk materials.

TABLE 3

| MATERIAL | RESISTIVITY [μΩcm] |
|---|---|
| Al | 6.23 |
| Ag | 2.56 |
| Ag—0.9 wt % Pd—1.0 wt % Cr | 7.31 |
| Ag—0.9 wt % Pd—1.0 wt % Si | 7.45 |
| Ag—0.9 wt % Pd—1.0 wt % Ti | 5.34 |
| Ag—0.9 wt % Pd—1.0 wt % Cu | 3.23 |

By contrast, the Ag alloy according to the present invention is subject to a little effect of oxygen, maintaining a resistivity increase up to 1.6 times of bulk materials. The resistivity resulted in as low as 2.56 μΩcm. When Cr, Si, Ti, and Cu are added to AgPd to create an alloy, added materials differently influence resistivities and rates of resistivity increases. Adding Cr and Si increases the resistivity compared to Al. Adding Cu and Ti decreases the resistivity compared to Al. Especially, adding Cu provided the sufficiently low resistivity of 3.23 μΩcm.

Table 4 shows a results of evaluating chemical resistances for respective film materials. The chemical resistance column in Table 2 summarizes the evaluation results in Table 4. For this evaluation test, samples were soaked in solutions 3% NaCl, 5% NaOH, 1% KOH, and 1% $H_2SO_4$ for 24 hours at a room temperature. After 24 hours, the samples were visually checked.

TABLE 4

| MATERIAL | 3% NaCl | 5% NaOH |
|---|---|---|
| Au | NO CHANGE | NO CHANGE |
| Al | COMPLETELY REACTED | COMPLETELY REACTED |
| Al—1.0 wt % Cu | COMPLETELY REACTED | COMPLETELY REACTED |
| Al—0.5 wt % Si | COMPLETELY REACTED | COMPLETELY REACTED |
| Al—0.5 wt % Si—1.0 wt % Cu | COMPLETELY REACTED | COMPLETELY REACTED |
| Ag | COMPLETELY REACTED | DISCOLORED |
| Ag—2 wt % Au | COMPLETELY REACTED | DISCOLORED |
| Ag—3 wt % Pd | SLIGHTLY DISCOLORED | DISCOLORED |
| Ag—0.1 wt % Pd—0.1 wt % Cu | SLIGHTLY DISCOLORED | SLIGHTLY DISCOLORED |
| Ag—3.0 wt % Pd—0.1 wt % Cu | SLIGHTLY DISCOLORED | SLIGHTLY DISCOLORED |
| Ag—1.0 wt % Pd—1.0 wt % Cu | NO CHANGE | NO CHANGE |
| Ag—2.0 wt % Pd—2.0 wt % Cu | NO CHANGE | NO CHANGE |
| Ag—0.1 wt % Pd—3.0 wt % Cu | SLIGHTLY DISCOLORED | SLIGHTLY DISCOLORED |
| Ag—3.0 wt % Pd—3.0 wt % Cu | NO CHANGE | NO CHANGE |

| MATERIAL | 1% KOH | 1% $H_2SO_4$ |
|---|---|---|
| Au | NO CHANGE | NO CHANGE |
| Al | COMPLETELY REACTED | COMPLETELY REACTED |
| Al—1.0 wt % Cu | COMPLETELY REACTED | COMPLETELY REACTED |
| Al—0.5 wt % Si | COMPLETELY REACTED | COMPLETELY REACTED |
| Al—0.5 wt % Si—1.0 wt % Cu | COMPLETELY REACTED | COMPLETELY REACTED |
| Ag | DISCOLORED | SLIGHTLY DISCOLORED |
| Ag—2 wt % Au | DISCOLORED | SLIGHTLY DISCOLORED |
| Ag—3 wt % Pd | DISCOLORED | SLIGHTLY DISCOLORED |
| Ag—0.1 wt % Pd—0.1 wt % Cu | SLIGHTLY DISCOLORED | SLIGHTLY DISCOLORED |
| Ag—3.0 wt % Pd—0.1 wt % Cu | SLIGHTLY DISCOLORED | SLIGHTLY DISCOLORED |
| Ag—1.0 wt % Pd—1.0 wt % Cu | NO CHANGE | NO CHANGE |
| Ag—2.0 wt % Pd—2.0 wt % Cu | NO CHANGE | NO CHANGE |
| Ag—0.1 wt % Pd—3.0 wt % Cu | SLIGHTLY DISCOLORED | SLIGHTLY DISCOLORED |
| Ag—3.0 wt % Pd—3.0 wt % Cu | NO CHANGE | NO CHANGE |

Except Au, conventional materials Al, AlCu, AlSi, and AlCuSi showed a loss of metallic luster or changes to opaque white and transparent. This means that these materials reacted on respective chemicals. By contrast, an AgPdCu alloy greatly improved the chemical resistance just by adding a small quantity of Pd and Cu (0.1 wt %) and only showed slight discoloration on the surface. It has been also found that increasing the additional amount of Pd and Cu improved the chemical resistance to such a degree that no changes occurred.

Tables 5 and 6 are showing stabilities against heat treatment and results of evaluating long-term reliability. We created each sample on a slide glass board using the sputtering method. Evaluation results in Table 5 are based on a visual check after leaving samples in a 100% oxygen atmosphere at 600° C. for 24 hours. Evaluation results in Table 6 are based on a visual check after leaving samples in an atmosphere at 90° C. in 85% humidity for 1,000 hours.

TABLE 5

| MATERIAL | TEST RESULT |
|---|---|
| Au | NO CHANGE |
| Cu | CHANGED TO BLACK |
| Al | CHANGED TO OPAQUE WHITE AND COMPLETELY OXIDIZED |
| Al—1.0 wt % Cu | CHANGED TO OPAQUE WHITE AND COMPLETELY OXIDIZED |
| Al—0.5 wt % Si | CHANGED TO OPAQUE WHITE AND COMPLETELY OXIDIZED |
| Al—0.5 wt % Si—1.0 wt % Cu | CHANGED TO OPAQUE WHITE AND COMPLETELY OXIDIZED |
| Ag | CHANGED TO YELLOW |
| Ag—2 wt % Au | CHANGED TO YELLOW |
| Ag—3 wt % Pd | CHANGED TO YELLOW |
| Ag—0.1 wt % Pd—0.1 wt % Cu | NO CHANGE |
| Ag—3.0 wt % Pd—0.1 wt % Cu | NO CHANGE |
| Ag—1.0 wt % Pd—1.0 wt % Cu | NO CHANGE |
| Ag—2.0 wt % Pd—2.0 wt % Cu | NO CHANGE |
| Ag—0.1 wt % Pd—3.0 wt % Cu | NO CHANGE |
| Ag—3.0 wt % Pd—3.0 wt % Cu | NO CHANGE |

TABLE 6

| MATERIAL | TEST RESULT |
|---|---|
| Au | NO CHANGE |
| Cu | CHANGED TO BLACK |
| Al | CHANGED TO OPAQUE WHITE AND COMPLETELY OXIDIZED |
| Al—1.0 wt % Cu | CHANGED TO OPAQUE WHITE AND COMPLETELY OXIDIZED |
| Al—0.5 wt % Si | CHANGED TO OPAQUE WHITE AND COMPLETELY OXIDIZED |
| Al—0.5 wt % Si—1.0 wt % Cu | CHANGED TO OPAQUE WHITE AND COMPLETELY OXIDIZED |
| Ag | CHANGED TO BLACK |
| Ag—2 wt % Au | CHANGED TO BLACK |
| Ag—3 wt % Pd | CHANGED TO BLACK |

TABLE 6-continued

| MATERIAL | TEST RESULT |
|---|---|
| Ag—0.1 wt % Pd—0.1 wt % Cu | NO CHANGE |
| Ag—3.0 wt % Pd—0.1 wt % Cu | NO CHANGE |
| Ag—1.0 wt % Pd—1.0 wt % Cu | NO CHANGE |
| Ag—2.0 wt % Pd—2.0 wt % Cu | NO CHANGE |
| Ag—0.1 wt % Pd—3.0 wt % Cu | NO CHANGE |
| Ag—3.0 wt % Pd—3.0 wt % Cu | NO CHANGE |

As shown in Table 5, an AgPdCu alloy containing 0.1 to 3.0 wt % of Pd and 0.1 to 3.0 wt % of Cu showed no change under this severe high-temperature environment. In addition to these tests, the same material was left in a 100% oxygen atmosphere at 750° C. for 24 hours. Also under this condition, no change was observed.

According to these tests, the relevant material was found to be stable during a high-temperature process at approximately 750° C. After film formation, the material does not vary with temperature without creating a protective film, thus simplifying the post-heat treatment after film formation.

The material was also found to be stable under conditions of high temperature and humidity, ensuring sufficient reliability for use as wiring materials and the like.

Table 7 shows a results of evaluating chemical resistance during a photolithography process. For this evaluation, we created a sample by forming an Ag-0.9 wt %Pd-1.0 wt %Cu film as thick as 150 nm on an Si substrate. This sample was subject to the resist development which is one of ordinary photolithography processes. Then the resist was baked for observation of changes in the sheet resistance. Actually, as a development process, the sample was soaked in 5% NaOH solution which is a main component of developing solution. As a resist bake process, the sample with resist applied was baked for 30 minutes at 120° C.

TABLE 7

| STATE | AFTER FILM FORMATION | AFTER SOAKED IN 5% NaOH SOLUTION (DEVELOPER COMPONENT) | BAKING FOR 30 MINUTES AT 120° C. (RESIST BAKING) |
|---|---|---|---|
| RESISTANCE (Ω/□) | 0.17 | 0.17 | 0.17 |

As shown in Table 7, this sample did not show changes in the sheet resistance before and after each process. It has been found that the sample can be applied to conventional photolithography processes and processed stably.

Table 8 shows a results of evaluating adherence to an underlayer film material of AgPdCu films. In order to evaluate this adherence, we created a sample by forming an underlayer film material using films Ti, Cr, W, Ta, and Mo, oxides and nitrides such as ITO (Indium Tin Oxide), titanium nitride, silicon nitride, silicon oxide and amorphous silicon, and then forming an AgPdCu film thereon. The substrate film thickness is 100 nm. The AgPdCu film thickness is 300 nm. For an evaluation purpose, we performed a peeling test using adhesive tapes. Samples were then etched in a nitrate solution and were visually checked for defects such as film peels.

TABLE 8

| BASE MATERIAL | FILM PEELING TEST |
|---|---|
| Ti | GREATLY PEELED |
| Cr | SLIGHTLY PEELED |
| W | NO PEELING |
| Ta | NO PEELING |
| Mo | NO PEELING |
| ITO | NO PEELING |
| TIN | NO PEELING |
| SIN | NO PEELING |
| $SIO_2$ | NO PEELING |
| AMORPHOUS SI | NO PEELING |

This evaluation result revealed that good adherence can be obtained except the Ti substrate. Though a slight peel was observed on the Cr substrate, it is considered that good adherence can be obtained by optimizing processes such as selecting film formation conditions.

Apart from the adherence evaluation in Table 8, we evaluated adherence to boards themselves by directly forming AgPdCu films on boards. According to this evaluation, no peel was observed on any of glass boards such as soda glass and silica glass, silicon wafer boards, and plastic boards such as polycarbonate, acrylic, and polyethylene terephthalate. It has been found that good adherence can be obtained when these materials are used for boards.

Table 9 shows a results of evaluating film formation rates according to the RF magnetron sputtering method. This evaluation uses an Ag alloy made of each film formation material for a 3-inch sputtering target. We formed a film on a board held 94 mm distant from this target and measured a time period until the film thickness on this substrate becomes 100 nm.

TABLE 9

| FILM MATERIAL | FILM FORMATION POWER (W) | FILM FORMATION TIME (min. sec) | FILM THICKNESS (nm) |
|---|---|---|---|
| AgPdCu | 300 | 75 sec | 100 |
| Ag | 300 | 86 sec | 100 |
| Au | 300 | 104 sec | 100 |
| Cu | 300 | 145 sec | 100 |
| Al | 300 | 273 sec | 100 |

This evaluation result shows that the film formation using the AgPdCu target proceeds approximately three times faster than that using the Al target. It has been found that using AgPdCu instead of Al as a metal material can reduce the time for film formation to one third and also shorten the manufacturing time.

This evaluation also showed an improvement of film formation speeds when compared to the use of Ag as a target. Compared to these conventional film formation materials, there is a little temperature rise on boards, making it known that plastic boards are also usable.

The above-mentioned embodiments describe adding one element selected from a group consisting of Al, Au, Pt, Cu, Ta, Cr, Ti, Ni, Co, and Si. The present invention is not limited to this. The present invention can be broadly applied to alloys containing 0.1 to 3 wt % in total of a plurality of elements selected from a group consisting of Al, Au, Pt, Cu, Ta, Cr, Ti, Ni, Co, and Si.

The above-mentioned embodiments describe the film formation using sputtering and the like. The present invention is not limited to this. The present invention can be broadly applied to other film formations and even to thick film formations.

What is claimed is:

1. A metal material containing Ag as a main component for electronic parts wherein:

the metal material comprises an alloy containing only 0.1 to 3 wt % of Pd and 0.1 to less than 3 wt % in total of at least any one of a plurality of elements selected from a group consisting of Al Cu, Ta, Cr, Ti, and Co, balance Ag.

2. The metal material for electronic parts as described in claim 1 wherein:

said metal material for electronic parts is a wiring material.

3. The metal material for electronic parts as described in claim 1 wherein:

an electrical resistivity is 3 $\mu\Omega$cm or less.

4. The metal material for electronic parts as described in claim 1 wherein:

said metal material for electronic parts is an electrode material.

5. The metal material for electronic parts as described in claim 1 wherein:

said metal material for electronic parts is a contact material.

6. The metal material for electronic parts as described in claim 1 wherein:

said metal material for electronic parts is a sputtering target material.

7. A metal material containing Ag as a main component for electronic parts wherein:

the metal material comprises a ternary alloy containing only 0.1 to 3 wt % to of Pd and 0.1 to less than 3 wt % of one element selected from a group consisting of Al, Cu, Ta, Cr, Ti, and Co, balance Ag.

8. The metal material for electronic parts as described in claim 7 wherein:

said metal material for electronic parts is a wiring material.

9. The metal material for electronic parts as described in claim 7 wherein:

an electrical resistivity is 1.6 $\mu\Omega$cm or more and 3.5 $\mu\Omega$cm or less.

10. The metal material for electronic parts as described in claim 7 wherein:

said metal material for electronic parts is an electrode material.

11. The metal material for electronic parts as described in claim 7 wherein:

said metal material for electronic parts is a sputtering target material.

12. An electronic part having a wiring pattern, electrode, or contact made of a specific metal material:

said metal material comprises an alloy containing only 0.1 to 3 wt % of Pd and 0.1 to less than 3 wt % of one element selected from a group consisting of Al, Cu, Ta, Cr, Ti, and Co, balance of Ag.

13. The electronic part as described in claim 12 wherein:

said wiring pattern, electrode, or contact is formed by means of etching through use of a solution containing phosphoric acid.

14. The electronic part as described in claim 12 wherein:

said wiring pattern, electrode, or contact is formed by means of etching in a gas atmosphere containing chlorine.

15. The electronic part as described in claim 12 wherein:

portions other than said wiring pattern, electrode, and contact are processed by means of etching in a gas atmosphere containing fluorine.

16. The electronic part as described in claim 12 wherein:

said wiring pattern, electrode, or contact is heat-treated at a temperature ranging from 300° C. to 750° C.

17. An electronic apparatus having a wiring pattern, electrode or contact made of a specific metal material:

said metal material comprises an alloy containing only 0.1 to 3 wt % of Pd and 0.1 to less than 3 wt % in total of one or a plurality of elements selected from a group consisting of Al, Cu, Ta, Cr, Ti, and Co, balance Ag.

18. The electronic apparatus as described in claim 17 wherein:

said wiring pattern, electrode, or contact is formed by means of etching through use of a solution containing phosphoric acid.

19. The electronic apparatus as described in claim 17 wherein:

said wiring pattern, electrode, or contact is formed by means of etching in a gas atmosphere containing chlorine.

20. The electronic apparatus as described in claim 17 wherein:

portions other than said wiring pattern, electrode, and contact are processed by means of etching in a gas atmosphere containing fluorine.

21. The electronic apparatus as described in claim 17 wherein:

said wiring pattern, electrode, or contact is beat-treated at a temperature ranging from 300° C. to 750° C.

22. An electro-optical part characterized by using a reflection film, an electrode or a wiring material made of a metal film of alloy, wherein said metal film of alloy containing only:

0.1 to 3 wt % of Pd and 0.1 to less than 3 wt % in total of one or a plurality of elements selected from a group consisting of Al, Cu, Ta, Cr, Ti and Co, balance Ag.

* * * * *